United States Patent
Lin et al.

(10) Patent No.: US 6,573,189 B1
(45) Date of Patent: Jun. 3, 2003

(54) MANUFACTURE METHOD OF METAL BOTTOM ARC

(75) Inventors: Shih-Chi Lin, Taipei (TW); Ming-Hua Yu, I-Lan (TW); Szu-An Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/044,859

(22) Filed: Nov. 7, 2001

(51) Int. Cl.$^7$ .............................................. H01L 21/302
(52) U.S. Cl. ........................ 438/725; 430/5; 438/717; 438/736; 427/569
(58) Field of Search ..................... 430/5; 438/725, 438/717, 736; 427/569

(56) References Cited

U.S. PATENT DOCUMENTS

| | | | |
|---|---|---|---|
| 5,759,746 A | 6/1998 | Azuma et al. | 430/313 |
| 5,831,321 A * | 11/1998 | Nagayama | 257/412 |
| 5,866,302 A | 2/1999 | Matsuoka et al. | 430/313 |
| 6,051,282 A * | 4/2000 | Konjuh et al. | 427/539 |
| 6,159,863 A | 12/2000 | Chen et al. | 438/720 |
| 6,174,816 B1 * | 1/2001 | Yin et al. | 438/705 |
| 6,174,818 B1 | 1/2001 | Tao et al. | 438/733 |
| 6,218,292 B1 * | 4/2001 | Foote | 438/636 |
| 6,326,231 B1 * | 12/2001 | Subramanian et al. | 438/72 |
| 6,403,151 B1 * | 6/2002 | Davis et al. | 427/162 |
| 2002/0052127 A1 * | 5/2002 | Gau et al. | 438/786 |

* cited by examiner

*Primary Examiner*—G Goudreau
(74) *Attorney, Agent, or Firm*—George O. Saile; Stephen B. Ackerman; Rosemary L. S. Pike

(57) ABSTRACT

A new method of preventing photoresist footing by forming a silicon oxynitride ARC layer having an oxygen-rich surface is described. An insulating layer is provided on a substrate. A metal layer is deposited overlying the insulating layer. A silicon oxynitride antireflective coating layer having an oxygen-rich surface is deposited overlying the metal layer. A photoresist mask is formed overlying the antireflective coating layer wherein the antireflective coating layer prevents photoresist footing. The antireflective coating layer and the metal layer are etched away where they are not covered by the photoresist mask to complete formation of metal lines in the fabrication of an integrated circuit.

17 Claims, 2 Drawing Sheets

MANUFACTURE METHOD OF METAL BOTTOM ARC

BACKGROUND OF THE INVENTION

(1) Field of the Invention

The invention relates to a method of photolithographic etching of metal lines, and more particularly, to a method of photolithographic etching of metal lines without photoresist footing in the manufacture of integrated circuits.

(2) Description of the Prior Art

In the manufacture of integrated circuit devices, an antireflective coating (ARC) layer is applied over a metal layer to be patterned underlying the photoresist material. The ARC layer improves photolithographic resolution. However, after development of the photoresist material, footings may form at the interface between the photoresist mask and the ARC layer. FIG. 1 illustrates a metal layer 20 formed over an insulating layer 12 on a semiconductor substrate 10. An ARC layer 25 overlies the metal layer. Photoresist mask 45 has footings 47. The so-called footings form a sloped area at the surface of the ARC layer rather than the desired vertical photoresist sidewalls for best resolution. It is theorized that the resist footings are formed by the reaction between nitrogen in the ARC layer and the photoresist layer. $N_2O$ plasma treatment may be used to solve this problem. However, this solution requires extra processing time, an additional plasma treatment step, and reduced throughput.

U.S. Pat. No. 6,174,818 to Tao et al discloses a SiON ARC layer with an overlying sacrificial silicon oxide layer. Photoresist footings are optionally trimmed after development. U.S. Pat. No. 6,159,863 to Chen et al teaches a titanium or titanium nitride ARC layer with an overlying TEOS of SiON layer to prevent photoresist footing formation. U.S. Pat. No. 5,759,746 to Azuma et al uses an oxide/carbide ARC layer and overlying silicon dioxide layer to reduce footing. U.S. Pat. No. 5,866,302 to Matsuoka et al teaches the use of a reflowable ARC layer.

SUMMARY OF THE INVENTION

A principal object of the present invention is to provide an effective and very manufacturable method of etching metal lines.

Another object of the present invention is to provide a method of etching metal lines without photoresist footing.

A further object of the present invention is to provide a method of preventing photoresist footing using a novel ARC layer.

Yet another object of the present invention is to provide a method of preventing photoresist footing by forming a silicon oxynitride ARC layer having an oxygen-rich surface.

In accordance with the objects of this invention a new method of preventing photoresist footing by forming a silicon oxynitride ARC layer having an oxygen-rich surface is achieved. An insulating layer is provided on a substrate. A metal layer is deposited overlying the insulating layer. A silicon oxynitride antireflective coating layer having an oxygen-rich surface is deposited overlying the metal layer. A photoresist mask is formed overlying the antireflective coating layer wherein the antireflective coating layer prevents photoresist footing. The antireflective coating layer and the metal layer are etched away where they are not covered by the photoresist mask to complete formation of metal lines in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
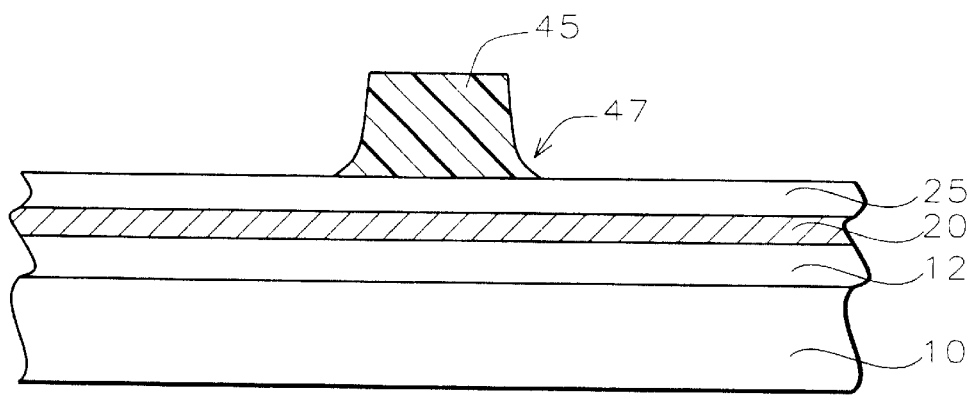
FIG. 1 schematically illustrates in cross-sectional representation the photoresist footing problem solved by the process of the present invention.
Figure 2:
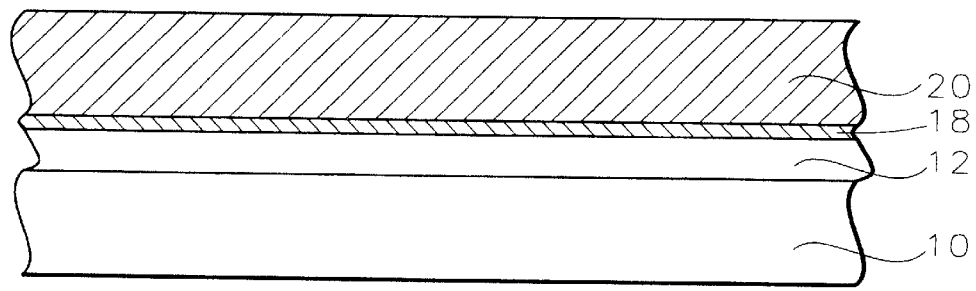
FIGS. 2 through 5 schematically illustrate in cross-sectional representation a preferred embodiment of the present invention.

Referring now more particularly to FIG. 2, there is illustrated a portion of a partially completed integrated circuit. Semiconductor substrate 10 is preferably composed of monocrystalline silicon. Semiconductor device structures, such as gate electrodes and source and drain regions, not shown, may be fabricated in and on the semiconductor substrate. A thick insulating layer of silicon dioxide or borophosphosilicate glass (BPSG), or the like, is blanket deposited over the semiconductor device structures. The semiconductor device structures and the overlying thick insulating layer are represented in the drawings by layer 12.

Now the metal stack will be formed. For example, a barrier layer 18 is deposited over the insulating layer 12. Then a metal layer 20, typically aluminum or an aluminum alloy such as AlCu is sputter deposited over the barrier layer typically to a thickness of between about 4000 and 8000 Angstroms. Then an antireflective coating (ARC) layer is deposited over the metal layer.

In a traditional process, a silicon oxynitride (SiON) ARC layer is deposited over the metal layer. Then the ARC layer is treated with a $N_2O$ plasma to form Si—O bonding to prevent photoresist footing. The $N_2O$ plasma treatment takes a long time (about 20 seconds) to form the transition zone of Si—O bonding at the surface of the metal-ARC interface. Furthermore, $N_2O$ plasma treatment may enhance particle contamination and may damage the chamber.

Figure 3:
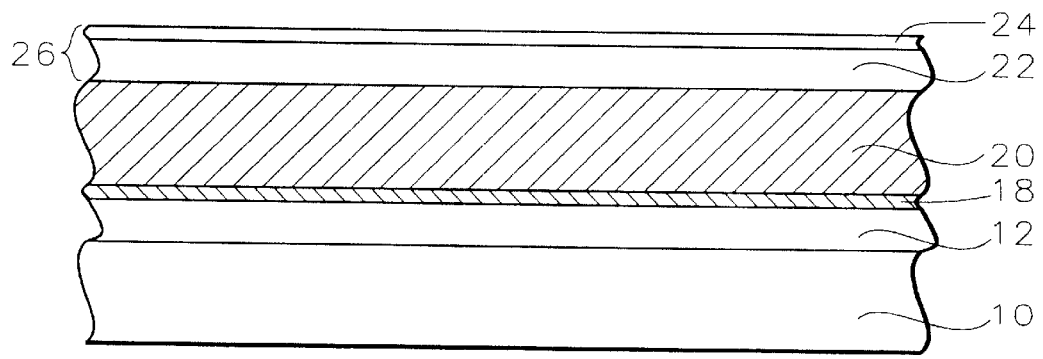

The novel ARC method of the present invention will now be described with reference to FIG. 3. An ARC layer 26 having an oxygen-rich surface is deposited overlying the metal layer 20. The ARC layer is deposited by flowing $SiH_4$ at between about 50 and 65 sccm and preferably about 53 sccm and flowing $N_2O$ at between about 85 and 96 and preferably about 90 sccm and flowing an inert gas such as He at about 1600 sccm for about 10 to 12 seconds to form a silicon oxynitride layer 22 having a thickness of between about 280 and 320 Angstroms. Preferably pressure is maintained at about 5.5 Torr, temperature at about 400° C., and power of about 100 watts. Now, without changing any of the other parameters, the gas flow ratio is changed to a $SiH_4$ flow rate of between about 5 to 20 sccm and preferably about 5 sccm and a $N_2O$ flow rate of between about 400 and 500 sccm and preferably about 450 sccm for between about 3 and 5 seconds to form an oxygen-rich surface layer 24 having a thickness of between about 15 and 25 Angstroms.

The novel ARC process of the present invention can decrease ARC formation time by about 30 seconds, thus greatly improving wafer throughput.

Figure 4:
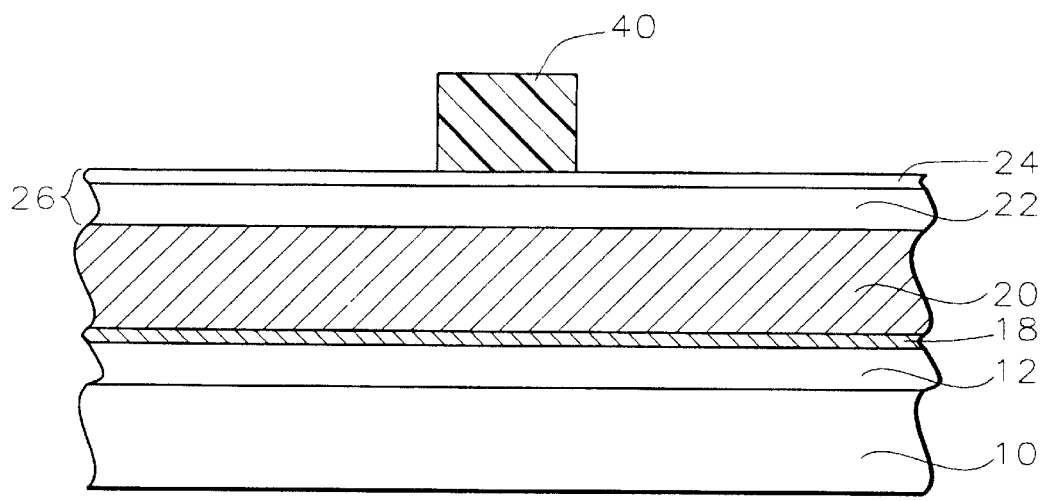
Figure 5:
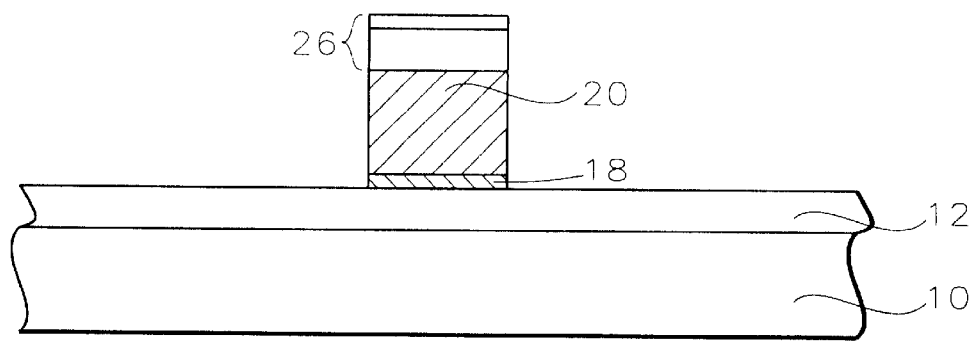

Referring now to FIG. 4, a layer of photoresist is coated over the ARC layer 26 and is exposed and developed to form the photoresist mask 40. The oxygen-rich SiON ARC layer prevents photoresist footing. Now, the metal stack is etched where it is not covered by the photoresist mask 40. FIG. 5 illustrates the completed metal line 20. Processing continues as is conventional in the art to complete the integrated circuit device.

The process of the present invention has been performed experimentally. ARC layer thickness uniformity, refraction index, and absorption were measured in experiments. Thickness uniformity was found to be good. Refraction index and absorption values were comparable with those achieved using the $N_2O$ plasma method.

It was desired for the method of the present invention to perform well even after the aggravated condition of rework. The photoresist process including photoresist deposition, exposure, development, and stripping was performed three times on a wafer. Critical dimension performance and uniformity of the ARC layer were measured after each successive rework step. Even after three rework steps, the process of the present invention showed improved photoresist critical dimension performance and good uniformity of the ARC layer.

The process of the present invention forms a silicon oxynitride ARC layer having an oxygen-rich surface layer. The surface layer is formed by increasing the $N_2O$ flow for only 3–5 seconds. This novel ARC layer prevents photoresist footing, provides improved critical dimension control, and improves throughput by 30% over the prior art.

While the invention has been particularly shown and described with reference to the preferred embodiments thereof, it will be understood by those skilled in the art that various changes in form and details may be made without departing from the spirit and scope of the invention.

What is claimed is:

1. A method of forming metal lines in the fabrication of an integrated circuit comprising:

providing an insulating layer on a substrate;

depositing a metal layer overlying substrate;

depositing an antireflective coating layer overlying said metal layer wherein said as deposited antireflective coating layer has an oxygen-rich top surface layer wherein said oxygen-rich top surface layer has a higher oxygen content than a remainder of said antireflective coating layer;

forming a photoresist mask overlying said antireflective coating layer; and etching away said antireflective coating layer and said metal layer where they are not covered by said photoresist mask to complete formation of said metal lines in said fabrication of said integrated circuit.

2. The method according to claim 1 wherein said insulating layer covers semiconductor device structures in and on said substrate wherein said semiconductor device structures include gate electrodes and source and drain regions.

3. The method according to claim 1 further comprising depositing a barrier layer underlying said metal layer.

4. The method according to claim 1 wherein said metal layer is selected from the group containing: aluminum and AlCu having a thickness of between about 4000 and 8000 Angstroms.

5. The method according to claim 1 wherein said step of depositing said antireflective coating layer comprises:

flowing $SiH_4$ at between about 50 and 65 sccm and flowing $N_2O$ at between about 85 and 95 sccm for between about 10 and 12 seconds to form a silicon oxynitride layer; and thereafter flowing $SiH_4$ at between about 5 and 20 sccm and flowing $N_2O$ at between about 400 and 500 sccm for between about 3 and 5 seconds to form said oxygen-rich surface of said silicon oxynitride layer.

6. The method according to claim 1 wherein said antireflective coating layer having said oxygen-rich surface prevents footing of said photoresist mask.

7. A method of forming metal lines in the fabrication of an integrated circuit comprising:

providing an insulating layer on a substrate;

depositing a metal layer overlying substrate;

depositing a silicon oxynitride antireflective coating layer overlying said metal layer wherein said as deposited silicon oxynitride antireflective coating layer has an oxygen-rich top surface layer wherein said oxygen-rich top surface layer has a higher oxygen content than a remainder of said silicon oxynitride antireflective coating layer;

forming a photoresist mask overlying said antireflective coating layer; and etching away said antireflective coating layer and said metal layer where they are not covered by said photoresist mask to complete formation of said metal lines in said fabrication of said integrated circuit.

8. The method according to claim 7 wherein said insulating layer covers semiconductor device structures in and on said substrate wherein said semiconductor device structures include gate electrodes and source and drain regions.

9. The method according to claim 7 further comprising depositing a barrier layer underlying said metal layer.

10. The method according to claim 7 wherein said metal layer is selected from the group containing: aluminum and AlCu having a thickness of between about 4000 and 8000 Angstroms.

11. The method according to claim 7 wherein said step of depositing said antireflective coating layer comprises:

flowing $SiH_4$ at between about 50 and 65 sccm and flowing $N_2O$ at between about 85 and 95 sccm for between about 10 and 12 seconds to form a silicon oxynitride layer; and thereafter flowing $SiH_4$ at between about 5 and 20 sccm and flowing $N_2O$ at between about 400 and 500 sccm for between about 3 and 5 seconds to form said oxygen-rich surface of said silicon oxynitride layer.

12. The method according to claim 7 wherein said antireflective coating layer having said oxygen-rich surface prevents footing of said photoresist mask.

13. A method of forming metal lines in the fabrication of an integrated circuit comprising:

providing an insulating layer on a substrate;

depositing a metal layer overlying substrate;

depositing a silicon oxynitride antireflective coating layer overlying said metal layer wherein said as deposited silicon nitride antireflective coating layer has an oxygen-rich top surface layer wherein said oxygen-rich top surface layer has a higher oxygen content than a remainder of said silicon oxynitride antireflective coating layer;

forming a photoresist mask overlying said antireflective coating layer wherein said antireflective coating layer prevents footing of said photoresist mask; and etching away said antireflective coating layer and said metal layer where they are not covered by said photoresist mask to complete formation of said metal lines in said fabrication of said integrated circuit.

14. The method according to claim 13 wherein said insulating layer covers semiconductor device structures in and on said substrate wherein said semiconductor device structures include gate electrodes and source and drain regions.

15. The method according to claim 13 further comprising depositing a barrier layer underlying said metal layer.

16. The method according to claim 13 wherein said metal layer is selected from the group containing: aluminum and AlCu having a thickness of between about 4000 and 8000 Angstroms.

17. The method according to claim 13 wherein said step of depositing said antireflective coating layer comprises:

flowing $SiH_4$ at between about 50 and 65 sccm and flowing $N_2O$ at between about 85 and 95 sccm for between about 10 and 12 seconds to form a silicon oxynitride layer; and thereafter flowing $SiH_4$ at between about 5 and 20 sccm and flowing $N_2O$ at between about 400 and 500 sccm for between about 3 and 5 seconds to form said oxygen-rich surface of said silicon oxynitride layer.

\* \* \* \* \*